United States Patent

Huang et al.

[11] Patent Number: 5,994,767
[45] Date of Patent: Nov. 30, 1999

[54] LEADFRAME FOR INTEGRATED CIRCUIT PACKAGE AND METHOD OF MANUFACTURING THE SAME

[75] Inventors: Chih-Kung Huang; Wei-Jen Lai, both of Hsinchu, Taiwan

[73] Assignee: Sitron Precision Co., Ltd., Taiwan, China

[21] Appl. No.: 09/083,444

[22] Filed: May 22, 1998

Related U.S. Application Data

[63] Continuation-in-part of application No. 08/870,906, Jun. 6, 1997, Pat. No. 5,889,317.

[30] Foreign Application Priority Data

Apr. 9, 1997 [TW] Taiwan ................................. 86104506

[51] Int. Cl.$^6$ ........................ H01L 23/495; H01L 23/48; H01L 23/28; H01L 29/44
[52] U.S. Cl. ...................... 257/666; 257/677; 257/676; 257/766; 257/736; 257/698; 257/762; 257/750
[58] Field of Search .................................. 257/666, 677, 257/766, 736, 767, 676, 752, 668, 762, 698; 29/827; 361/813

[56] References Cited

U.S. PATENT DOCUMENTS 5,635,755  6/1997  Kinghorn ................................ 257/666
5,684,329  11/1997  Serizawa ................................. 257/677

*Primary Examiner*—Alexander Oscar Williams
*Attorney, Agent, or Firm*—Finnegan, Henderson, Farabow, Garrett & Dunner, L.L.P.

[57] ABSTRACT

A leadframe for an IC package and a method of manufacturing the same are provided. The leadframe can be manufactured in such a manner as to provide suitable bondability, molding compound characteristic, and solderability. The leadframe includes a base structure made from a conductive material. A silver plating is formed over the base structure of the leadframe, and a palladium plating is formed over the silver plating. Depending on actual requirements, a copper layer and a nickel plating can be formed between the silver plating and the base structure of the leadframe, and a palladium/nickel plating can be formed between the silver and palladium platings. Further, a gold layer can be formed over the palladium plating. The palladium plating and the palladium/nickel plating can be formed all over the leadframe or selectively formed only in the external-lead area of the leadframe. The structure of the layering of one silver layer beneath the palladium plating allows the prevention of the occurrence of pin holes in the platings so that the bondability and solderability of the leadframe can be assured.

3 Claims, 13 Drawing Sheets

LEADFRAME FOR INTEGRATED CIRCUIT PACKAGE AND METHOD OF MANUFACTURING THE SAME

This application is a continuation-in-part of application Ser. No. 08/870,906 filed Jun. 6, 1997, now U.S. Pat. No. 5,889,317. Applicants claim the benefit of priority of Taiwanese Patent Application No. 86104506 filed Apr. 9, 1997.

BACKGROUND OF THE INVENTION

1. Field of the Invention

This invention relates to leadframes for integrated circuit (IC) packages, and more particularly, to a leadframe which is plated with silver (Ag) and palladium (Pd) in distinctive manners so as to provide suitable bondability, molding compound characteristic, and solderability for the packaging of a chip in the IC package. This invention also relates to a method for manufacturing the leadframe.

2. Description of Related Art

In the manufacture of semiconductor devices on integrated circuits (IC), the final step is to mount the chip on a leadframe and then enclose the chip and part of the leadframe in a plastic casing to form the so-called IC package. The IC package can be easily mounted on a printed circuit board for interconnection of the electronic devices on the chip with external circuitry. A leadframe should be manufactured in such a manner as to provide good bondability, molding compound characteristic, and solderability, so that it can facilitate the packaging process. To provide these characteristics, various coatings are formed on the leadframe.

A conventional method for providing suitable bondability for the interconnection between gold wires and leads of a leadframe is to plate silver (Ag) on the bonding area of the leadframe. After the chip is sealed in a plastic casing, the external leads of the IC package are plated with a layer of the alloy of tin/lead (Sn/Pb) so as to provide suitable solderability for the external leads of the IC package to be easily mounted on a printed circuit board by soldering.

One drawback to the process of plating the Sn/Pb alloy on the external leads, however, is that the high-temperature condition of the plating process can cause damage to the IC package and the chip. Moreover, the use of the tin/lead (Sn/Pb) alloy can cause the problem of heavy metal pollution to the environment.

Further, since the plating of silver (Ag) on the bonding area is carried out prior to the packaging of the chip in a plastic casing and the plating of the tin/lead (Sn/Pb) alloy on the external leads is carried out after the chip is packaged, the automation of the overall packaging process is difficult to implement. To solve this problem, the so-called pre-plated frame (PPF) technology is developed.

The PPF technology involves the plating of palladium (Pd) instead of silver (Ag) and tin/lead (Sn/Pb) on the leadframe. Conventional PPF methods include U.S. application Ser. No. 874,916 filed on Jun. 16, 1986, and U.S. application Ser. No. 174,060 filed on Mar. 28, 1988 by Texas Instruments (TI) Incorporated, to name a few. Since the palladium (Pd) metal is good both in bondability and solderability, it can be plated over the entire leadframe prior to the packaging process so that the ensuring packaging process can be carried out easily by automation. In this case, the plating of the Sn/Pb alloy in the prior art is eliminated. Therefore, the PPF technology is quite an environmentally friendly solution.

By the PPF technology, however, in order to allow the leadframe to be erosion-resistant, a film of nickel (Ni) and a film of the alloy of palladium/nickel (Pd/Ni) are plated on the leadframe before plating the palladium (Pd) metal. Since palladium (Pd) is a precious metal which is quite costly to use, the platings are usually very thin, typically from 0.075 μm to 0.1 μm (micrometer) only. Due to such a small thickness, the thin palladium (Pd) platings can be easily ruined during the packaging process, which causes the forming of undesired pin holes in the platings. The forming of these pin holes will expose the nickel (Ni) and palladium/nickel (Pd/Ni) platings, so that it will significantly degrade the bondability and solderability of the leadframe.

SUMMARY OF THE INVENTION

It is therefore a primary objective of the present invention to provide a leadframe and a method of manufacturing the same, which allows the prevention of the occurrence of "pin holes" in the platings so that the bondability and solderability of the leadframe can be assured.

In accordance with the foregoing and other objectives of the present invention, an improved leadframe and a method of manufacturing the same are provided. In the method of the invention, the first step is to provide a base structure of the leadframe from a conductive material. Functionally, the base structure is divided into one external-lead area and one package area including one bonding area having one die pad therein. There are various ways to form a copper layer, a nickel plating, a silver layer, a palladium/nickel (Pd/Ni) plating, a palladium (Pd) plating, and a gold layer on the leadframe, either over the entire leadframe or selectively only over specific portions of the leadframe. These variations will be described in full detail in the detailed description section later in this specification. In particular, the method of the invention provides a leadframe on which a silver plating is formed beneath a palladium plating.

On the leadframe, the silver plating is formed over the base structure of the leadframe, and the palladium plating is formed over the silver plating. Depending on actual requirements, a copper layer and a nickel plating can be formed between the silver plating and the base structure of the leadframe, and a palladium/nickel plating can be formed between the silver and palladium platings.

Further, a gold layer can be formed over the palladium plating. The palladium plating and the palladium/nickel plating can be formed all over the leadframe or selectively formed only in the external-lead area of the leadframe.

The distinguishing feature of the leadframe of the invention is the forming of one palladium plating over one silver layer in the external-lead area of the leadframe. This feature allows the prevention of the occurrence of pin holes in the platings so that the bondability and solderability of the leadframe can be assured.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
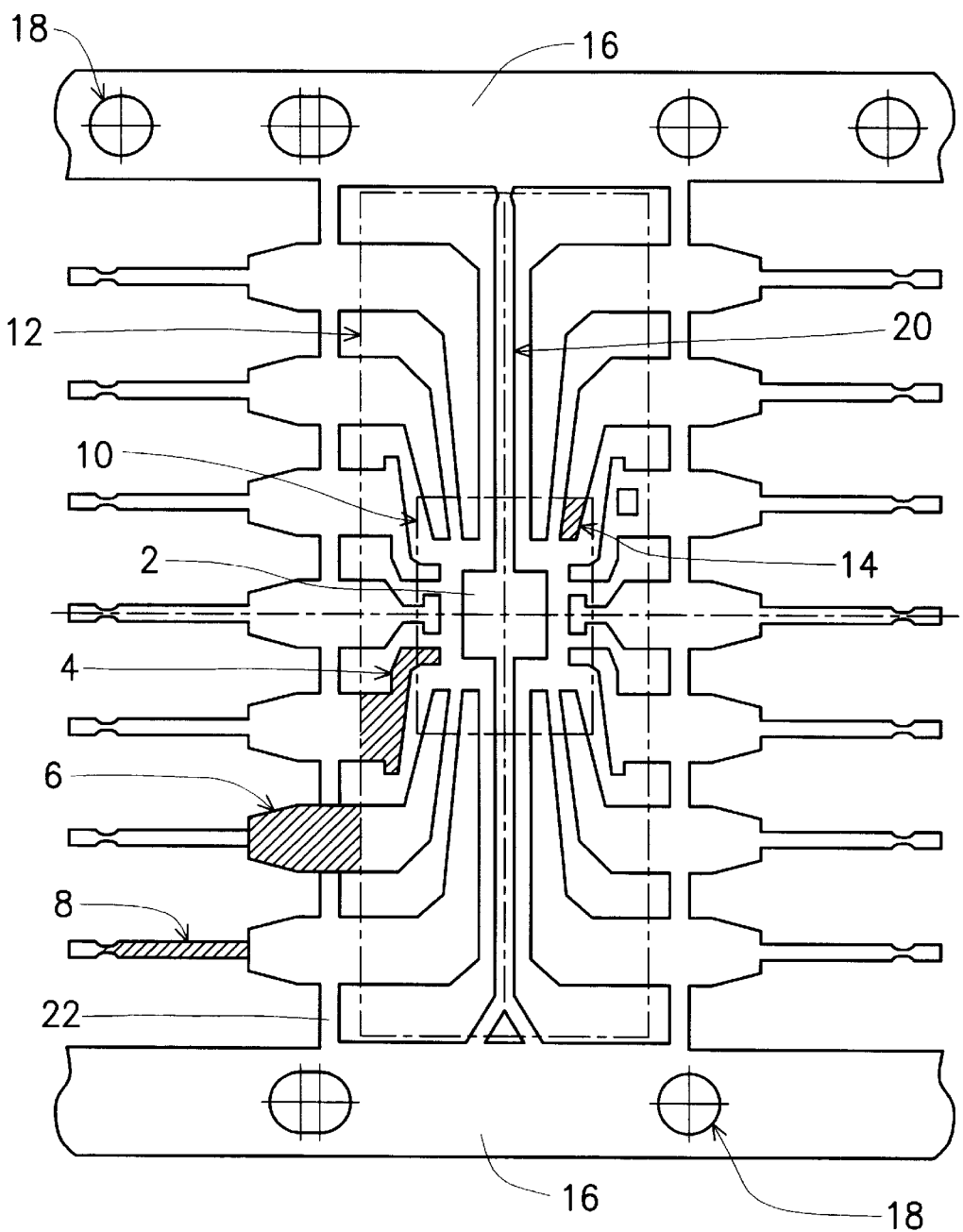
FIG. 1 is a schematic top view of a leadframe.

FIG. 1 is a schematic top view of a common leadframe, which includes a flat portion 2 customarily referred to as a "bar pad" or "die pad" in the terminology of semiconductor fabrications (hereinafter referred to as "die pad" in this specification) on which a chip (not shown) is to be mounted. The die pad 2 is supported by a tie bar 20 on a pair of parallel side rails 16. Further, the leadframe includes a lead portion including a number of internal leads 4 that are to be connected directly to the chip (not shown) that is to be mounted on the leadframe, a number of corresponding lead shoulders 6 connected to the internal leads 4, and a number of corresponding external leads 8 that are connected to the lead shoulders 6 for connection to external circuitry on a printed circuit board (not shown).

Functionally, the leadframe is divided into a package area, as the area enclosed by a dashed box pointed out by the reference numeral 12, which includes a bonding area (or called a coin area), as the area enclosed by a dashed box pointed out by the reference numeral 10, therein and the internal leads 4. The bonding area 10 includes the die pad 2 and the free end (referred to as coin-lead tip) 14 of the internal leads 4. The area beyond the package area 12 on the leadframe includes the lead shoulders 6 and the external leads 8 and is hereinafter referred to as the external-lead area of the leadframe.

The leadframe is manufactured in multiple on a single piece of metal and each leadframe is connected to the neighboring ones through the side rails 16. In order to facilitate automation to the manufacturing process, a plurality of pilot holes 18 are formed in the side rails 16 which can assist the alignment of the leadframe. The tie bar 20 is oriented lengthwise across the center of the package area 12 so as to support the die pad 2 on the side rails 16. A plurality of dam bars 22 can prevent the melted plastic to flow to the outside during the packaging process.

First Preferred Embodiment

Figure 2A:
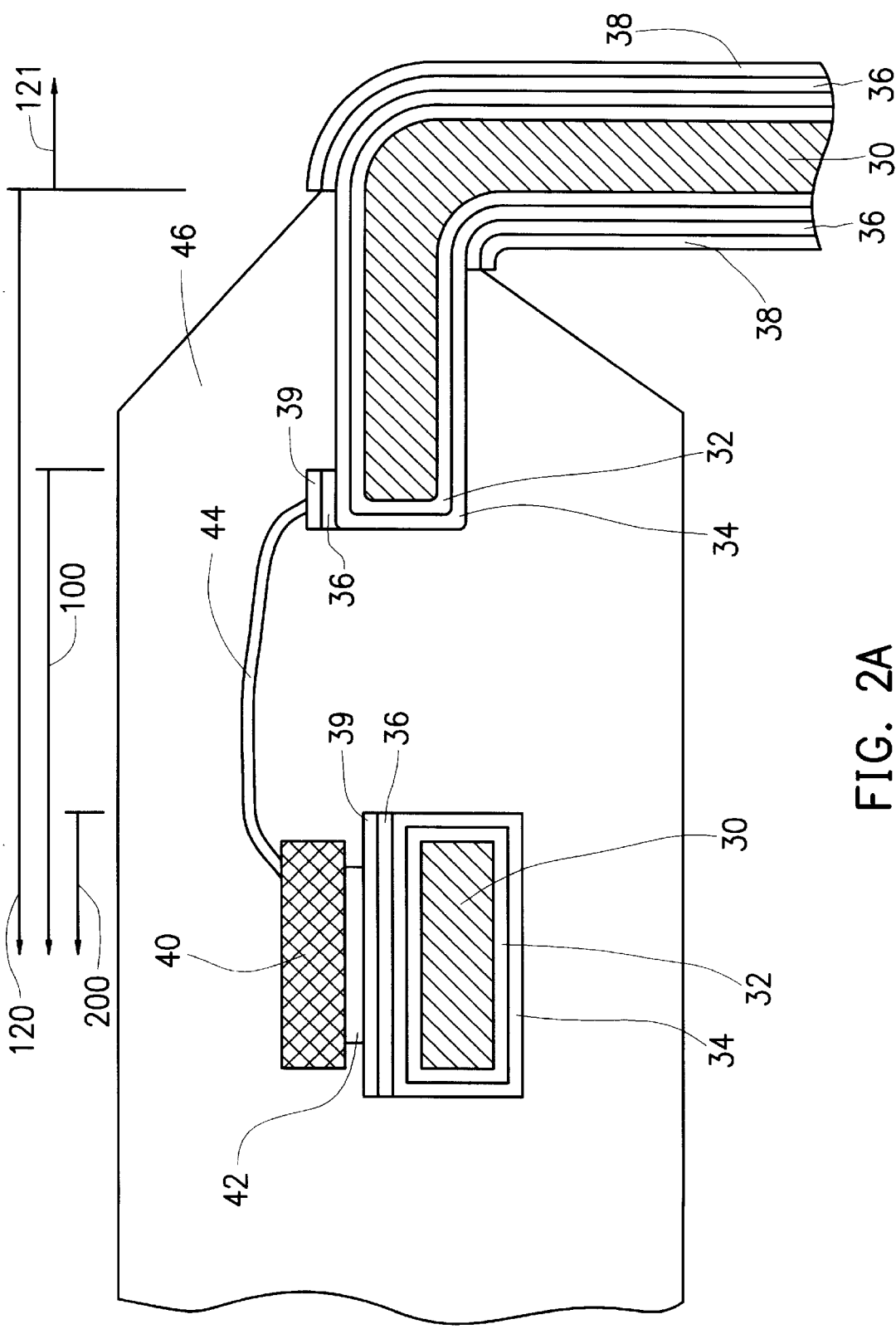
FIG. 2A is a schematic sectional diagram of a first preferred embodiment of the leadframe of the invention.
Figure 2B:
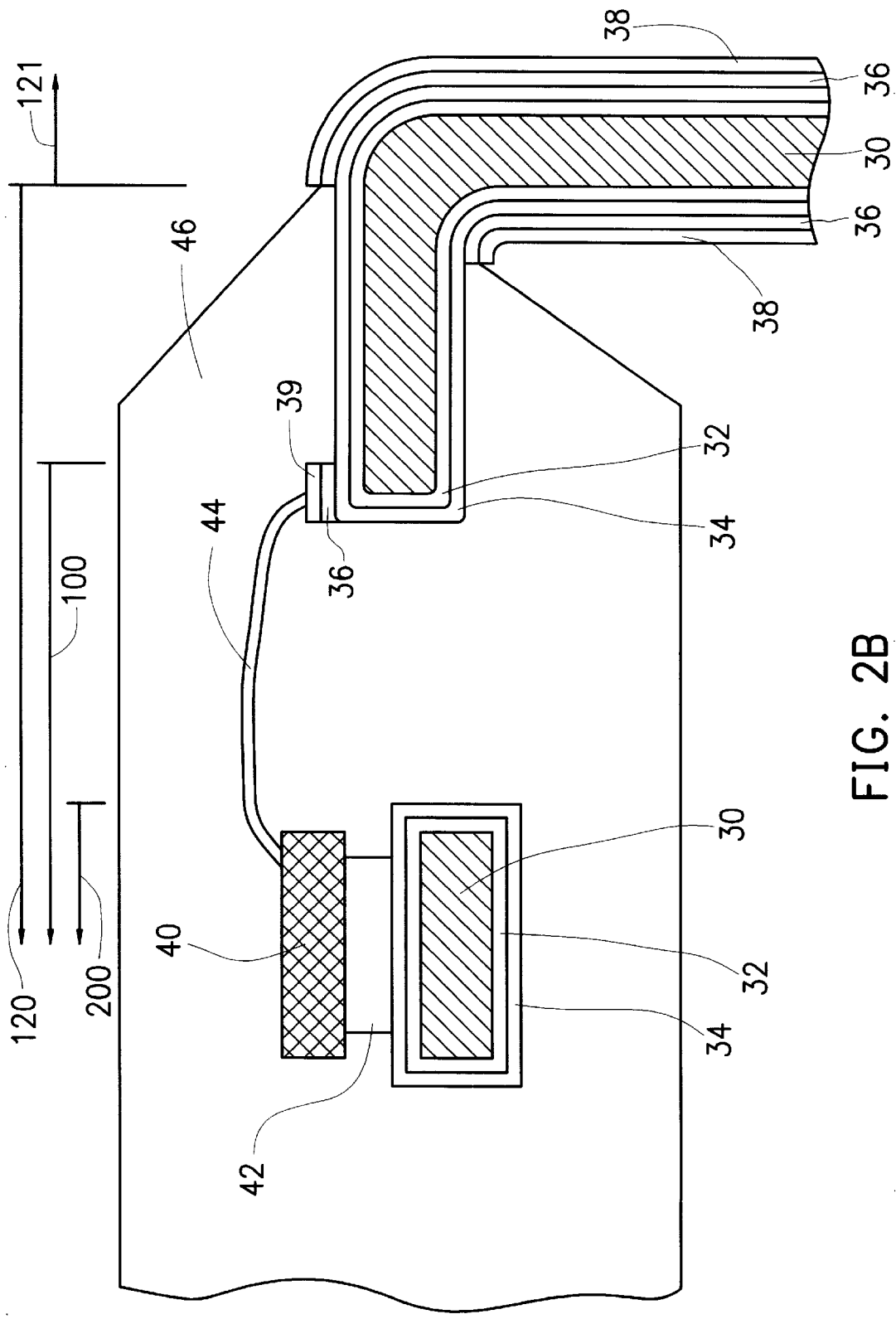
FIG. 2B is a schematic sectional diagram showing the leadframe of FIG. 2A when a ring plating process is used instead to form the silver (Ag) layers in the leadframe.

FIG. 2A shows a schematic sectional view of a first preferred embodiment of the leadframe according to the invention. In this sectional diagram, the package area is indicated by the reference numeral 120 on top of the drawing; the bonding area is indicated by the reference numeral 100; the die pad is indicated by the reference numeral 200; and the area beyond the package area, referred to as an external-lead area of the leadframe, is indicated by the reference numeral 121.

In the manufacturing process, the first step is to form a base structure 30 from a conductive material which is molded into a form as shown in FIG. 1. The base structure 30 of the leadframe can be made from various conductive materials such as copper alloys including Alloy 194, C7025, KCF125, EFTEC, or nickel/ferrite alloys such as the Ni-Fe 42 alloy. This base structure 30 is then subjected to a series of pre-plating processes, including degreasing, activating, etching, neutralizing, forming a copper layer 32 by striking over the entire base structure 30, and forming a nickel plating 34 over the copper layer 32. The copper layer 32 is used to improve the surface quality of the base structure 30 of the leadframe, and the nickel plating 34 is used to prevent erosion to the leadframe. If the base structure 30 is made from a conductive material of high surface quality, the step of forming the copper layer 32 can be eliminated. The step of forming the nickel plating 34 can be replaced by a subsequent step of forming a corrosion-resistant layer later over the leadframe.

Subsequently, a first silver (Ag) layer 36 is formed by striking over the entire surface of the nickel plating 34; and then a second silver (Ag) layer 39 is formed by spotting selectively only on the top side of the leadframe within the bonding area 100. Next, a palladium (Pd) plating 38 is formed selectively only over one part of the first silver (Ag) layer 36 that is formed in the external-lead area 121 of the leadframe. After this, those portions of the first silver (Ag) layer 36 in the package area 120 that are uncovered by the second silver (Ag) layer 39 are removed so as to expose the underlying portions of the nickel plating 34. This completes the manufacture of the first preferred embodiment of the leadframe of the invention.

In conclusion, the leadframe is made from a base structure of a conductive nature, such as a copper alloy, which is then formed successively with the copper layer 32, the nickel plating 34 over the copper layer 32, the first silver (Ag) layer 36 selectively formed only over the portions of the nickel plating 34 that are settled in the bonding area 100 and the external-lead area 121 of the leadframe, the palladium (Pd) plating 38 selectively formed only over the portions of the first silver (Ag) layer 36 that are settled in the external-lead area 121 of the leadframe, and the second silver (Ag) layer 39 selectively formed only over the portions of the first silver (Ag) layer 36 that are settled in the bonding area 100 on the top side of the leadframe. In the foregoing structure, the copper layer 32 and nickel plating 34 are not mandatory and can be eliminated in accordance with actual requirements. In the case of not forming the copper layer 32 and nickel plating 34, the first silver (Ag) layer 36 is formed directly over the surface of the base structure 30 of the leadframe.

In the subsequent packaging process, a chip 40 is mounted on the die pad 200 of the leadframe by using a gluing agent 42, such as silver epoxy. In the bonding process, a plurality of gold wires 44, each having one end bonded to one bonding pad (not shown) on the chip 40 and the other end bonded to the second silver (Ag) layer 39 on the internal leads, are used to interconnect the chip 40 and the second silver (Ag) layer 39 on the coin-lead tip 14 of the internal leads 4 (shown in FIG. 1). A plastic casing 46 is then molded to enclose the chip 40, gold wires 44, and internal leads 4 therein, with the external-lead area 121 being exposed to the outside of the plastic casing 46.

One distinguishing feature of the foregoing embodiment is the forming of the palladium (Pd) plating 38 in the external-lead area 121 of the leadframe and the underlying portions of the first silver (Ag) layer 36 beneath the palladium (Pd) plating 38. The step of forming the palladium (Pd) plating 38 can be carried out in three various manners, as respectively described in the following with reference to FIGS. 3A, 4A and 5A.

Figure 3A:
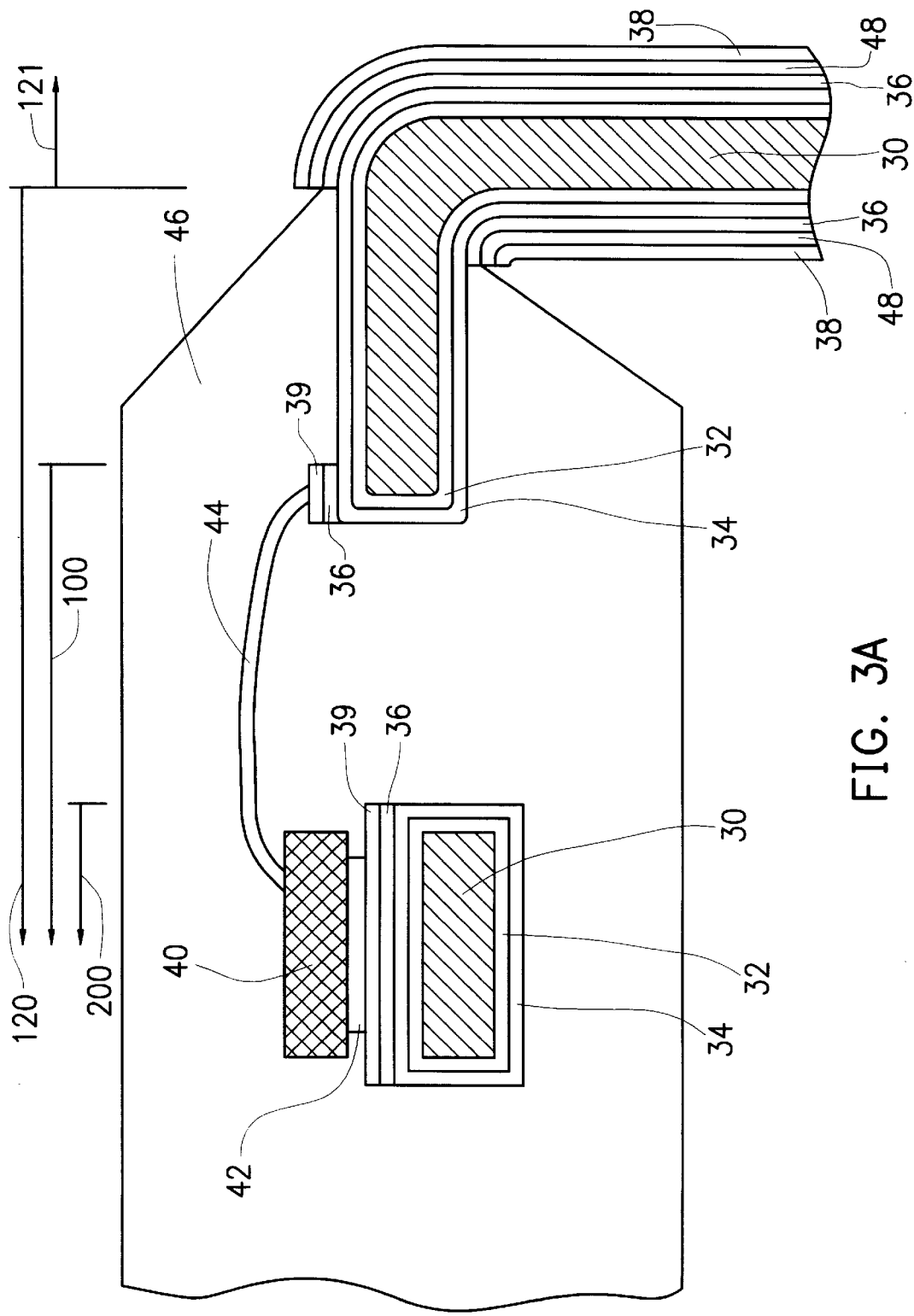
FIG. 3A is a schematic sectional diagram showing a first variation of the leadframe of FIG. 2A.
Figure 3B:
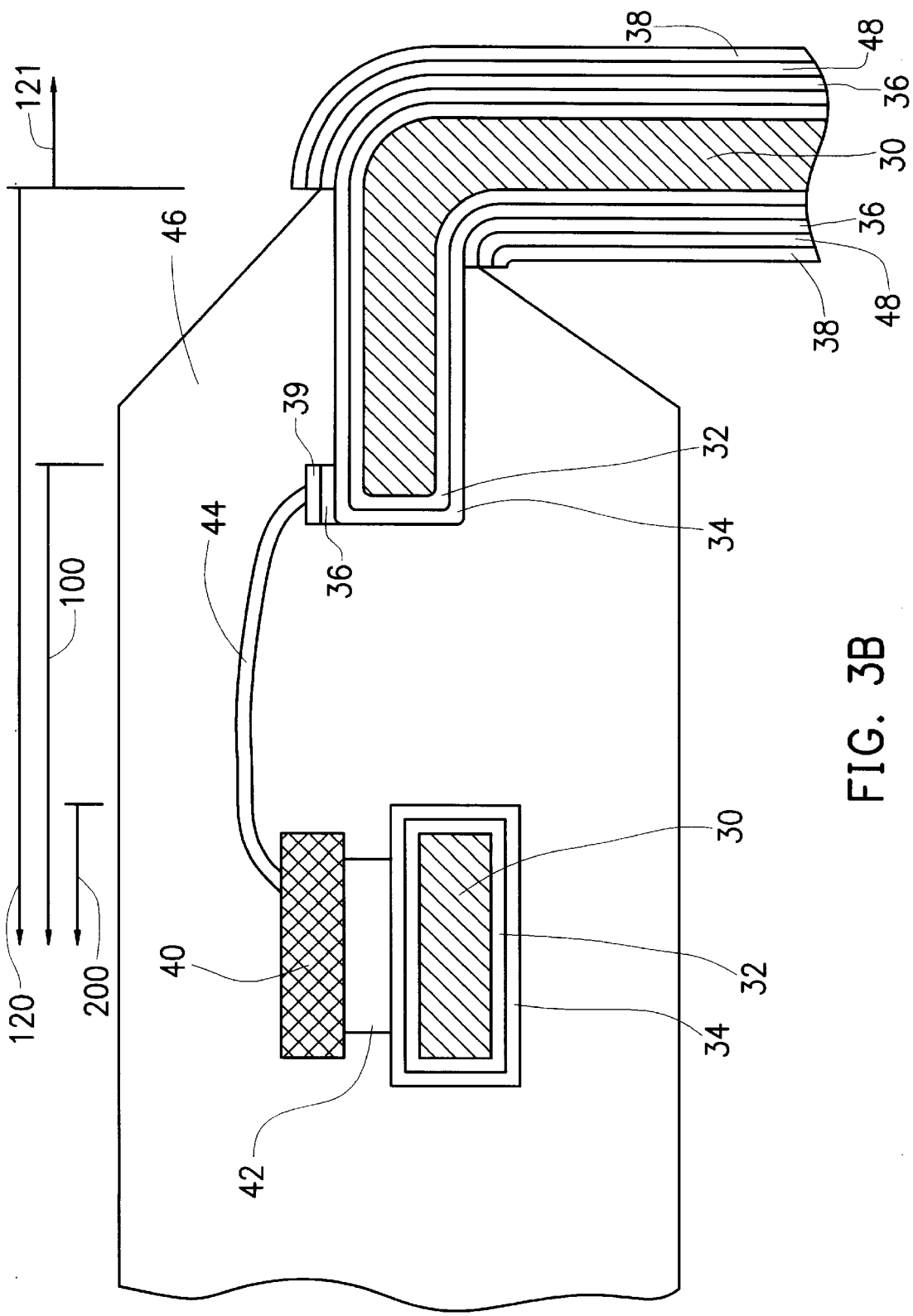
FIG. 3B is a schematic sectional diagram showing the leadframe of FIG. 3A when a ring plating process to used to form the silver (Ag) layers.

Referring to FIG. 3A, in the first variation of the first embodiment, after the first silver (Ag) layer 36 is formed over the nickel plating 34 and a second silver (Ag) layer 39 is formed selectively only in the bonding area 100, a plating of the alloy of palladium/nickel (Pd/Ni) 48 is formed selectively only over the first silver (Ag) layer 36 in the external-lead area 121 of the leadframe. Next, a palladium (Pd) plating 38 is formed over the palladium/nickel (Pd/Ni) alloy layer 48. After this, those portions of the first silver (Ag) layer 36 in the package area 120 that are uncovered by the second silver (Ag) layer 39 are removed so as to expose the underlying portions of the nickel plating 34. As a result of the foregoing process, this leadframe differs from the leadframe of FIG. 2A in that one palladium/nickel (Pd/Ni) alloy layer 48 is additionally formed between the first silver (Ag) layer 36 and the palladium (Pd) plating 38 in the external-lead area 121.

Figure 4A:
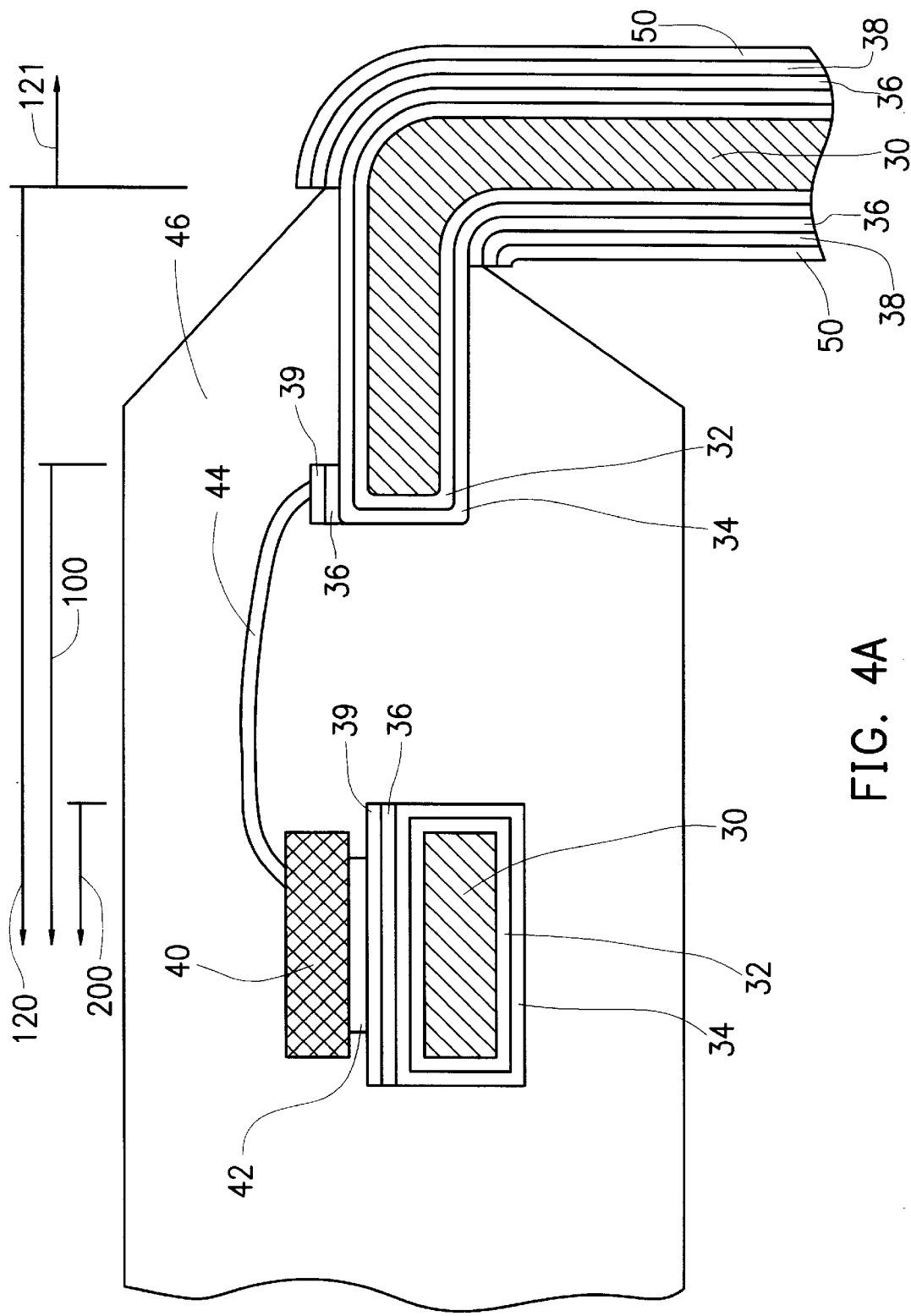
FIG. 4A is a schematic sectional diagram showing a second variation of the leadframe of FIG. 2A.
Figure 4B:
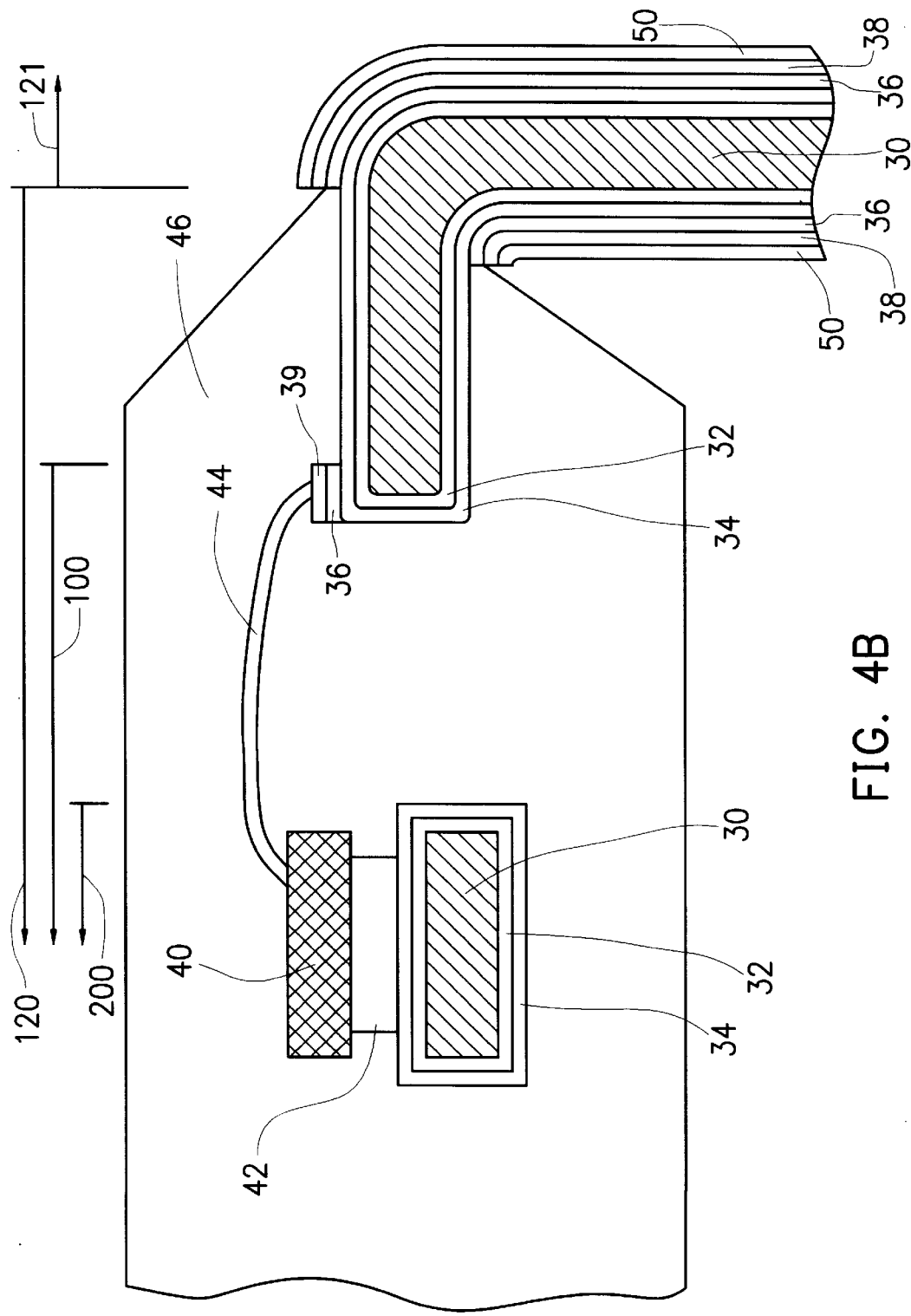
FIG. 4B is a schematic sectional diagram showing the leadframe of FIG. 4A when a ring plating process to used to form the silver (Ag) layers.

Referring to FIG. 4A, in the second variation of the first embodiment, after the first silver (Ag) layer 36 is formed over the nickel plating 34 and a second silver (Ag) layer 39 is formed selectively only in the bonding area 100, a palladium (Pd) plating 38 is formed selectively only over those portions of the first silver (Ag) layer 36 that are settled in the external-lead area 121 of the leadframe. Next, a gold layer 50 is formed by flashing selectively only over the palladium (Pd) plating 38 in the external-lead area 121. After this, those portions of the first silver (Ag) layer 36 in the package area 120 that are uncovered by the second silver (Ag) layer 39 are removed so as to expose the underlying portions of the nickel plating 34. As a result of the foregoing process, this leadframe differs from the leadframe of FIG. 2A in that one gold layer 50 is formed over the palladium (Pd) plating 38 formed over the first silver (Ag) layer 36 in the external-lead area 121 of the leadframe.

Figure 5A:
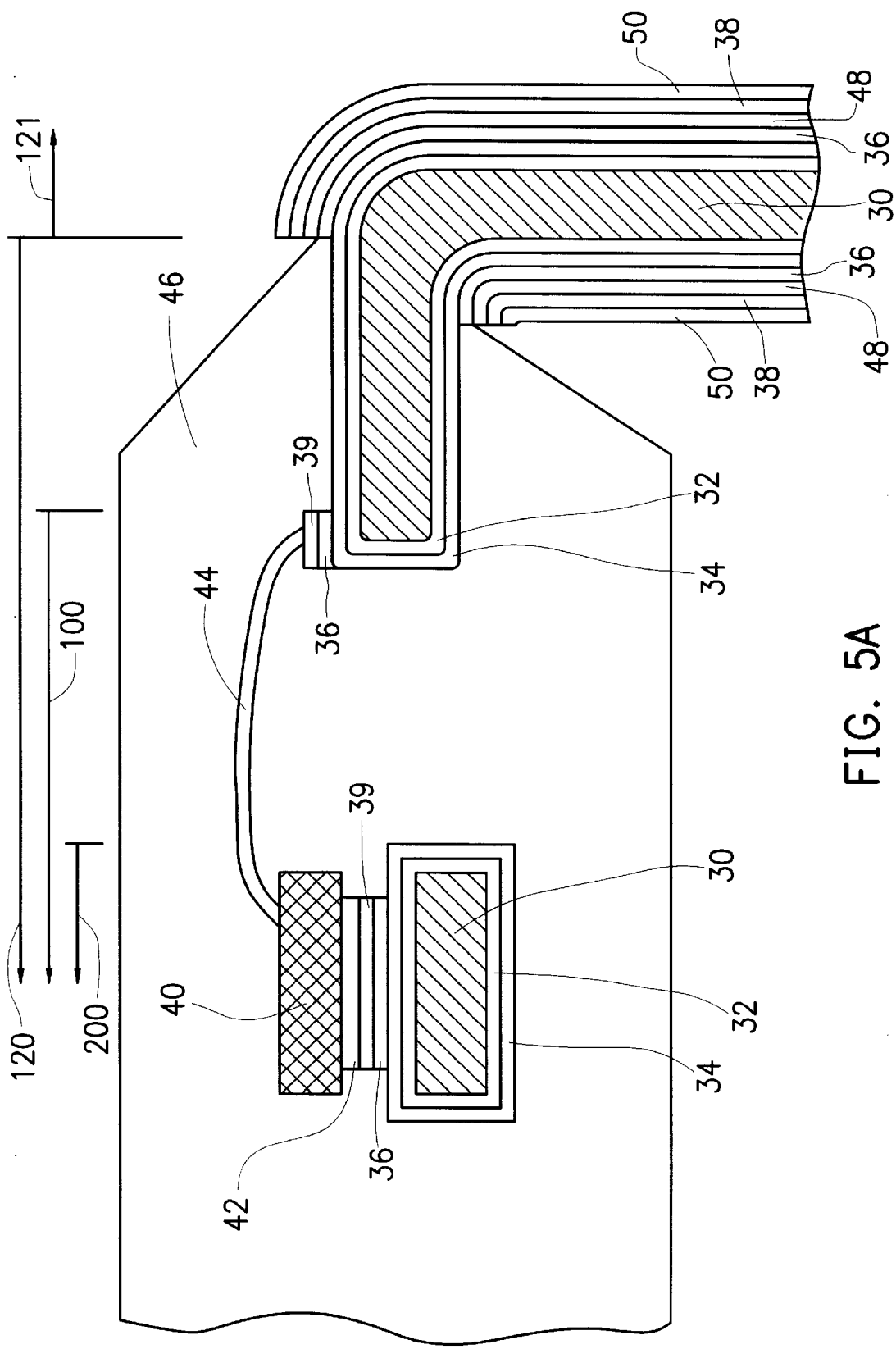
FIG. 5A is a schematic sectional diagram showing a third variation of the leadframe, of FIG. 2A.
Figure 5B:
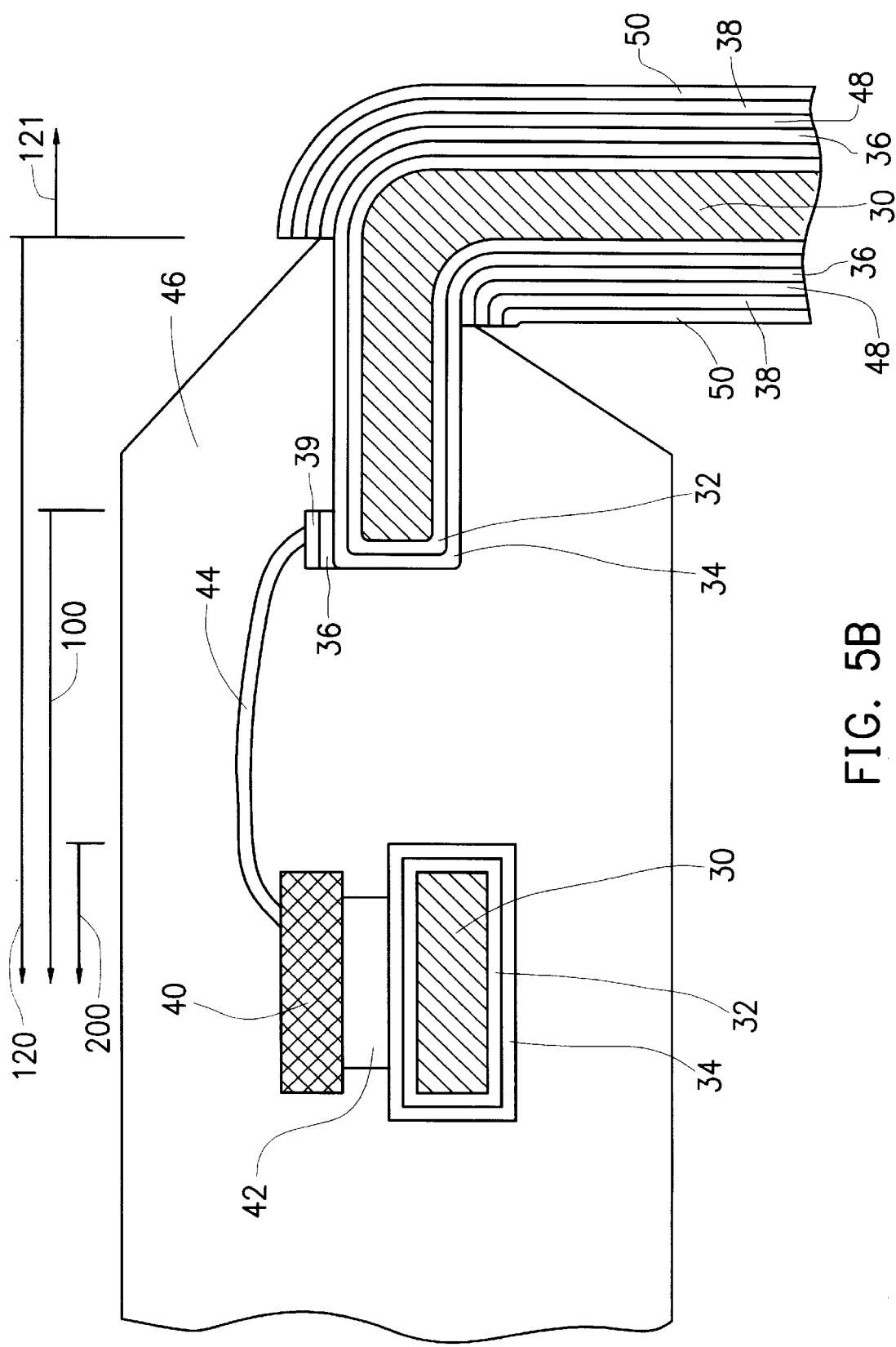
FIG. 5B is a schematic sectional diagram showing the leadframe of FIG. 5A when a ring plating process to used to form the silver (Ag) layers.

Referring to FIG. 5A, in the third variation of the first embodiment, after the first silver (Ag) layer 36 is formed over the entire surface of the nickel plating 34, a plating of the alloy of palladium/nickel (Pd/Ni) 48 is formed selectively only over those portions of the first silver (Ag) layer 36 that are settled in the external-lead area 121 of the leadframe. Next, a palladium (Pd) plating 38 is formed over the palladium/nickel (Pd/Ni) plating 48, and then a gold layer 50 is formed over the palladium (Pd) plating 38 in the external-lead area 121 of the leadframe. Subsequently, a second silver (Ag) layer 39 is formed selectively only over the first silver (Ag) layer 36 in the bonding area 100. After this, those portions of the first silver (Ag) layer 36 in the package area 120 that are uncovered by the second silver (Ag) layer 39 are removed so as to expose the underlying portions of the nickel plating 34. As a result of the foregoing process, this leadframe differs from the leadframe of FIG. 2A in that the surface of the leadframe in the external-lead area 121 of the leadframe is formed with a stacked layer including the first silver (Ag) layer 36, the palladium/nickel (Pd/Ni) plating 48 over the first silver (Ag) layer 36, the palladium (Pd) plating 38 over the palladium/nickel (Pd/Ni) plating 48, and the gold layer 50 over the palladium (Pd) plating 38.

The foregoing description discloses the manufacture of four variations of the leadframe of the invention. In these four variations, the first silver (Ag) layer 36 is at first formed over the entire leadframe and the second silver (Ag) layer 39 is at first formed in the bonding area 100 of the leadframe. Alternatively, the first silver (Ag) layer 36 and second silver (Ag) layer 39 can be formed by a ring plating method. In this method, the first silver (Ag) layer 36 is formed selectively only over the nickel plating 34 in the bonding area 100 excluding the die pad 200 (corresponding to the coin-lead tip 14 of the internal leads 4 shown in FIG. 1); and the second silver (Ag) layer 39 is formed also by a ring plating process over the first silver (Ag) layer 36. Through the ring plating process, those portions of the first silver (Ag) layer 36 and second silver (Ag) layer 39 that are laid on the die pad 200 in the embodiments of FIGS. 2A, 3A, 4A, and 5A are not formed. The resultant structures are respectively illustrated in FIGS. 2B, 3B, 4B, and 5B. The structures of FIGS. 2B, 3B, 4B, and 5B differ from that of FIGS. 2A, 3A, 4A, and 5A only in that the structures of FIGS. 2B, 3B, 4B, and 5B include no silver (Ag) layers on the die pad 200 as the structures of FIGS. 2A, 3A, 4A, and 5A in which the die pad 200 is formed with two silver layers, the first silver (Ag) layer 36 and second silver (Ag) layer 39, thereon.

From the foregoing description, it is apparent that the leadframe of the invention has the following several benefits. First, the use of palladium (Pd) platings instead of the conventional tin/lead (Sn/Pb) platings in the external-lead area 121 of the leadframe is environmentally friendly. Second, the forming of the palladium (Pd) platings only at selected areas instead on the entire leadframe allows for a reduction in the manufacturing cost of the leadframe. Third, since the bonding area is still plated with silver (Ag), this process can be carried out by existing equipment with the same parameter settings. The silver (Ag) platings have good bondability with gold wires and silver epoxy. Fourth, since a silver plating is formed beneath the palladium (Pd) plating, the problem of the occurrence of pin holes in the palladium (Pd) platings is here not experienced. Fifth, the plating process for the leadframe is completely done before carrying out the packaging process, which is a feature provided by the PPF technology that allows the packaging process to be carried out by automation. Sixth, the exposed areas of the nickel plating or copper in the non-bonding areas in the package area provide molding compound characteristic for the leadframe.

Second Preferred Embodiment

Figure 6A:
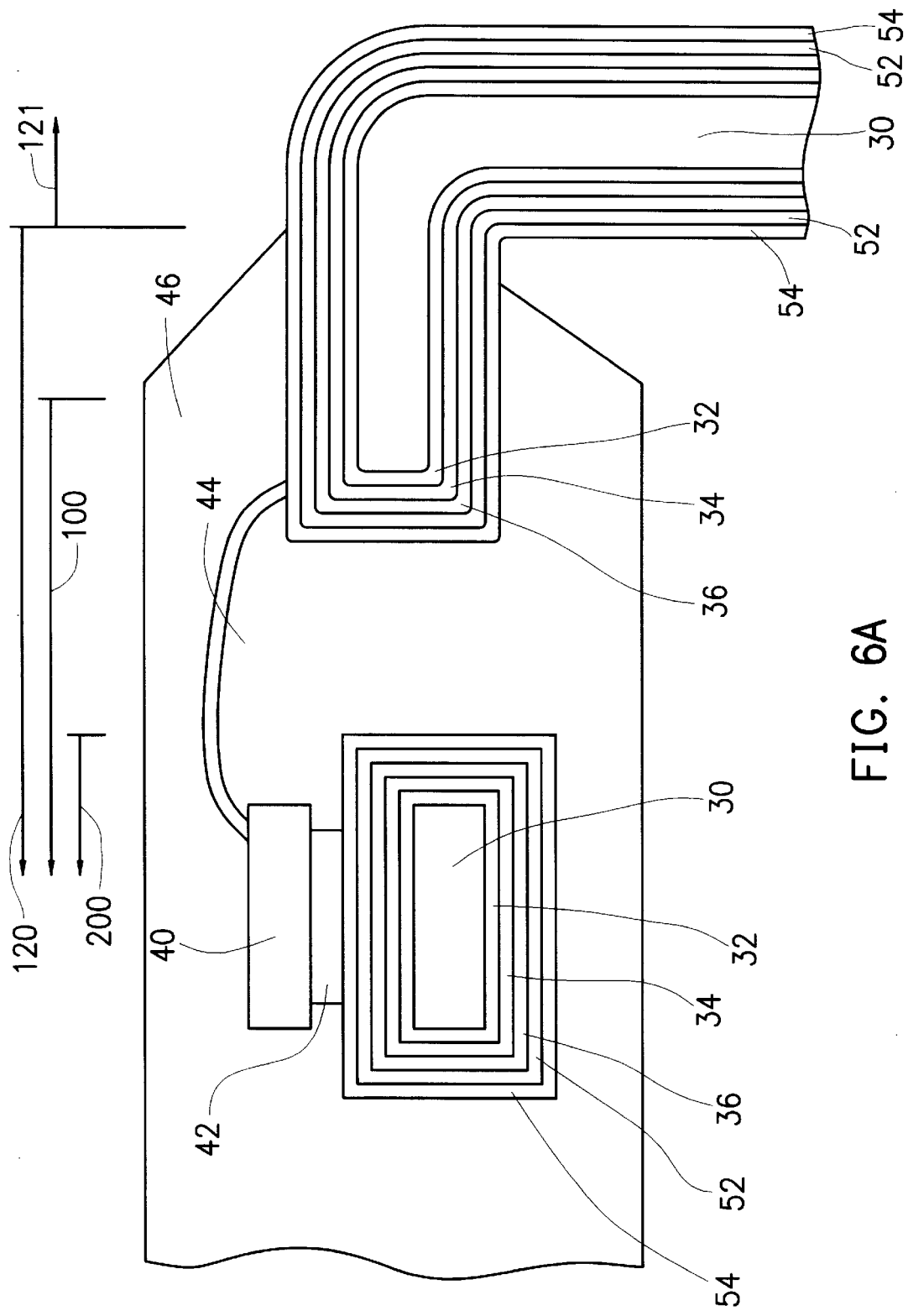
FIG. 6A is a schematic sectional diagram of a second preferred embodiment of the leadframe of the invention.

FIG. 6A shows a schematic sectional view of a second preferred embodiment of the leadframe according to the invention. The elements in this embodiment that are identical in structure to those in the first embodiment shown in FIG. 2A are labeled with the same reference numerals.

In the manufacturing process for the second preferred embodiment of the leadframe, the first step is to form a base structure 30 from a conductive material which is molded into a form as shown in FIG. 1. The base structure 30 of the leadframe can be made from various conductive materials such as copper alloys including Alloy 194, C7025, KCF 125, EFTEC, or nickel/ferrite alloys such as the Ni—Fe 42 alloy. This base structure 30 is then subjected to a series of pre-plating processes, including degreasing, activating, etching, neutralizing, forming a copper layer 32 by striking over the entire base structure 30, and forming a nickel plating 34 over the copper layer 32. The copper layer 32 is used to improve the surface quality of the base structure 30 of the leadframe, and the nickel plating 34 is used to prevent erosion to the leadframe. If the base structure 30 is made from a conductive material of high surface quality, the step of forming the copper layer 32 can be eliminated. The step of forming the nickel plating 34 can be replaced by a subsequent step of forming a corrosion-resistant layer later over the leadframe.

Subsequently, a silver (Ag) layer 36 is formed by striking over the nickel plating 34 over the entire leadframe. Next, a plating of the alloy of palladium/nickel (Pd/Ni) 52 is formed over the silver (Ag) layer 36 over the entire leadframe, and then a palladium (Pd) plating 54 is formed over the palladium/nickel (Pd/Ni) plating 52 over the entire leadframe. This completes the manufacture of the second preferred embodiment of the leadframe of the invention. In this embodiment, the forming of the palladium/nickel (Pd/Ni) plating 52 is not mandatory but dependent on actual requirements. If the palladium/nickel (Pd/Ni) plating 52 is not formed, the palladium (Pd) plating 54 is formed directly over the silver (Ag) layer 36.

In conclusion, the second preferred embodiment provides a leadframe made from a base structure 30 of a conductive nature, such as a copper alloy, which is then formed successively with the copper layer 32 over the entire base structure 30 of the leadframe, the nickel plating 34 over the copper layer 32, the silver (Ag) layer 36 over the nickel plating 34, the palladium/nickel (Pd/Ni) plating 52 over the silver (Ag) layer 36, and the palladium (Pd) plating 54 over the palladium/nickel (Pd/Ni) plating 52. In this structure, the copper layer 32 and nickel plating 34 are not mandatory and can be eliminated in accordance with actual requirements. If this is the case, the silver (Ag) layer 36 is formed directly over the surface of the base structure 30 of the leadframe. One distinguishing feature of this leadframe is the forming of the silver (Ag) layer 36 beneath the palladium (Pd) plating 38.

In the subsequent packaging process, a chip 40 is mounted securely by using a gluing agent 42 on the die pad 200 of the leadframe 30. In the bonding process, a plurality of gold wires 44, each having one end bonded to one bonding pad (not shown) on the chip 40 and the other end bonded to the coin-lead tip 14 of the corresponding one of the internal leads 4 (shown in FIG. 1), are used to interconnect the chip 40 and the palladium (Pd) plating 54 on the coin-lead tip 14 of the internal leads 4 (shown in FIG. 1). A plastic casing 46 is then molded to enclose the chip 40, gold wires 44, and internal leads 4 therein, with the external-lead area 121 being exposed to the outside of the plastic casing 46.

Figure 6B:
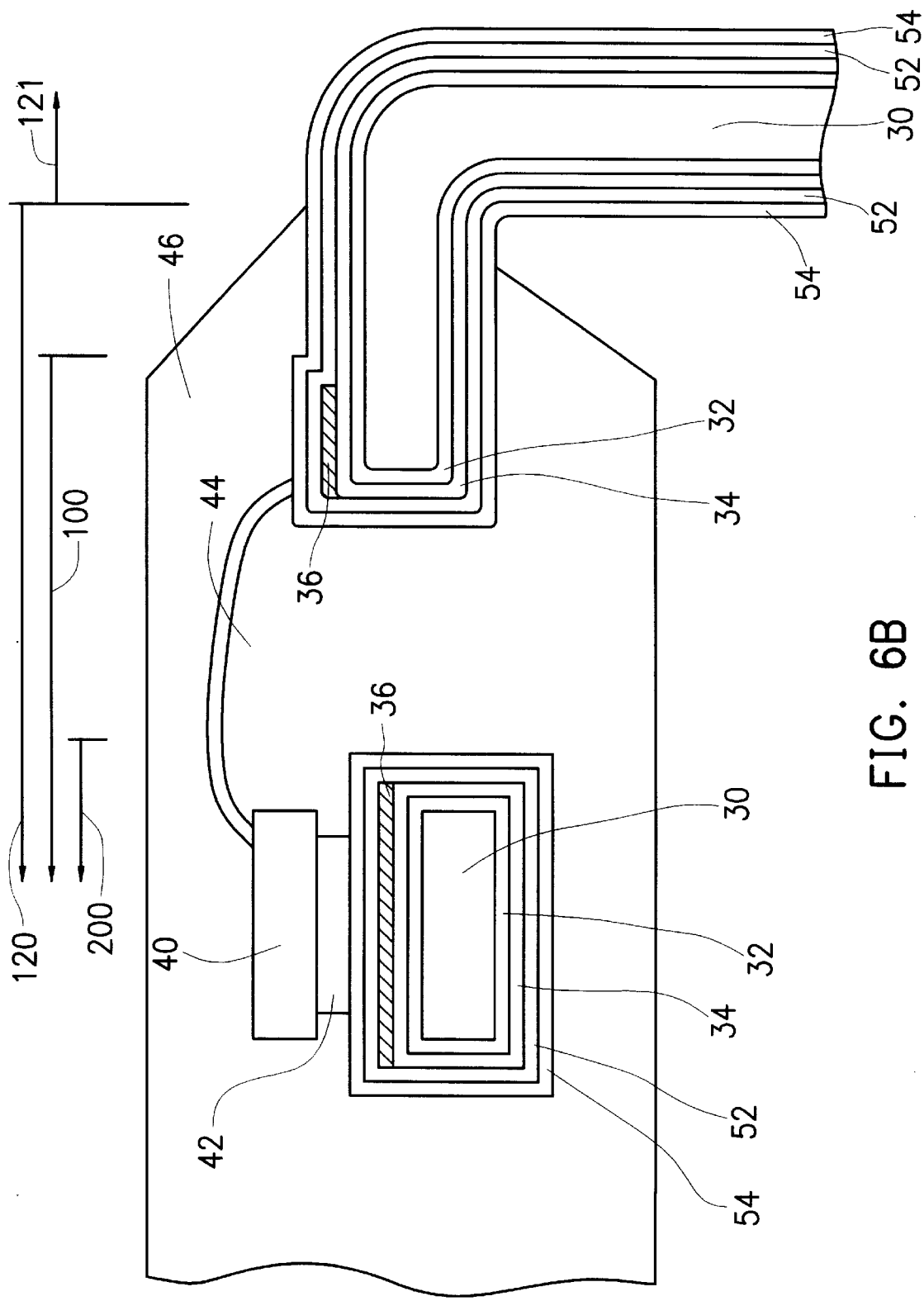
FIG. 6B is a schematic sectional diagram showing a first variation of the leadframe of FIG. 6A.

The step of forming the silver (Ag) layer 36 can be carried out in two various manners, as respectively described in the following with reference to FIGS. 6B and 6C. Referring to FIG. 6B, in the first variation of the second embodiment, the silver (Ag) layer 36 is formed by striking selectively only over the nickel plating 34 in the bonding area 100. Subsequently, the palladium/nickel (Pd/Ni) plating 52 is formed all over the exposed surfaces of the silver (Ag) layer 36 and the nickel plating 34. Further, the palladium (Pd) plating 54 is formed all over the palladium/nickel (Pd/Ni) plating 52. The resultant structure of the leadframe is as that shown in FIG. 6B. This variation has the benefit of saving manufacturing cost.

Figure 6C:
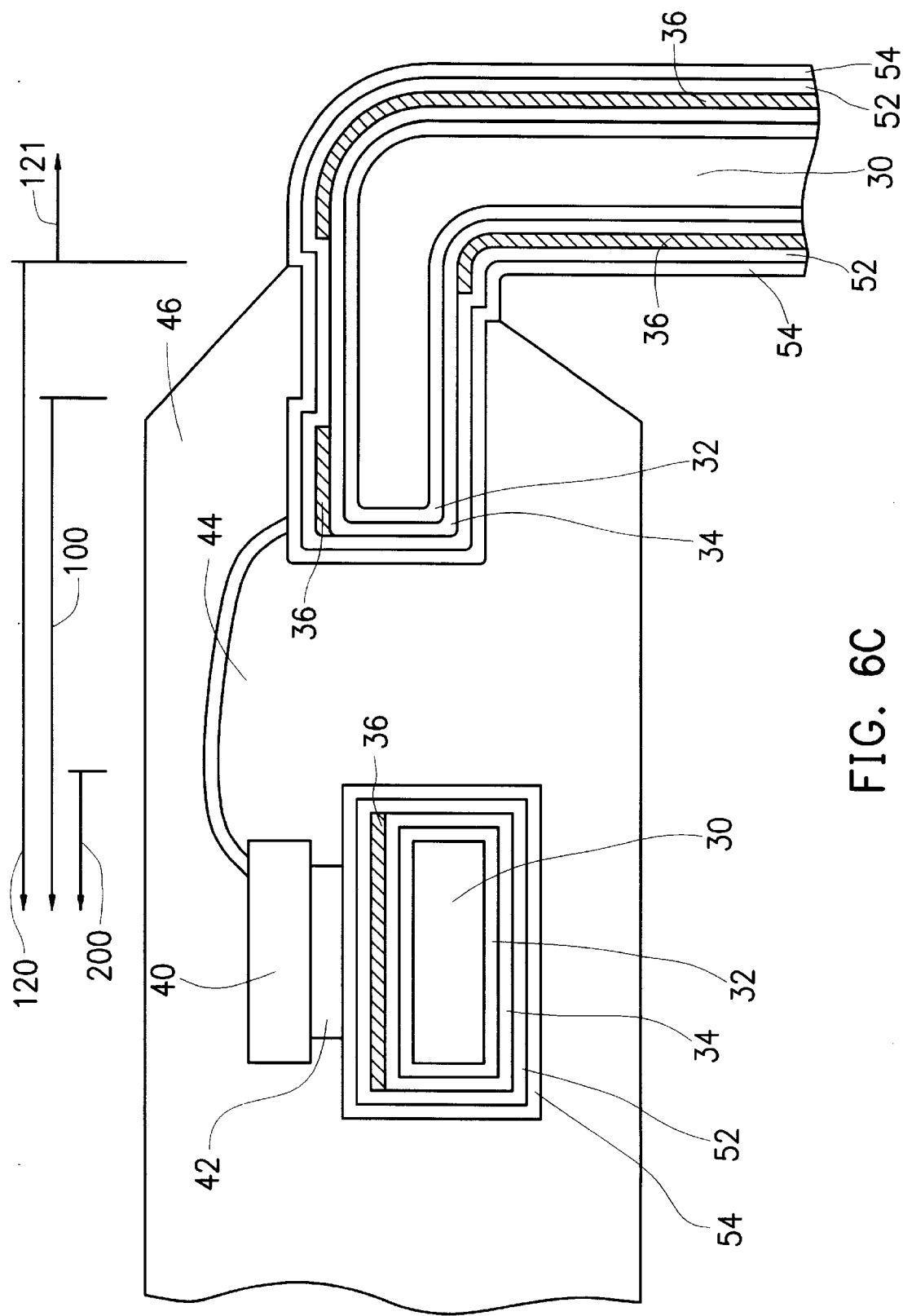
FIG. 6C is a schematic sectional diagram showing a second variation of the leadframe of FIG. 6A.

Referring to FIG. 6C, in the second variation of the second embodiment, the silver (Ag) layer 36 is formed by striking selectively only over the nickel plating 34 both in the bonding area 100 and in the external-lead area 121 of the leadframe. Subsequently, the palladium/nickel (Pd/Ni) plating 52 is formed all over the exposed surface of the silver (Ag) layer 36 and the nickel plating 34. Further, the palladium (Pd) plating 54 is formed all over the surface of the palladium/nickel (Pd/Ni) plating 52. The resultant structure of the leadframe is as that shown in FIG. 6C.

In the second preferred embodiment, the forming of the silver (Ag) layer 36 beneath the palladium (Pd) plating 38 can prevent the occurrence of pin holes that expose the base structure and thus cause degradation to the bondability of the bonding area and the solderability of the external-lead area. Moreover, the forming of gold layers by flashing is eliminated so that manufacturing cost is reduced.

Third Preferred Embodiment

Figure 7:
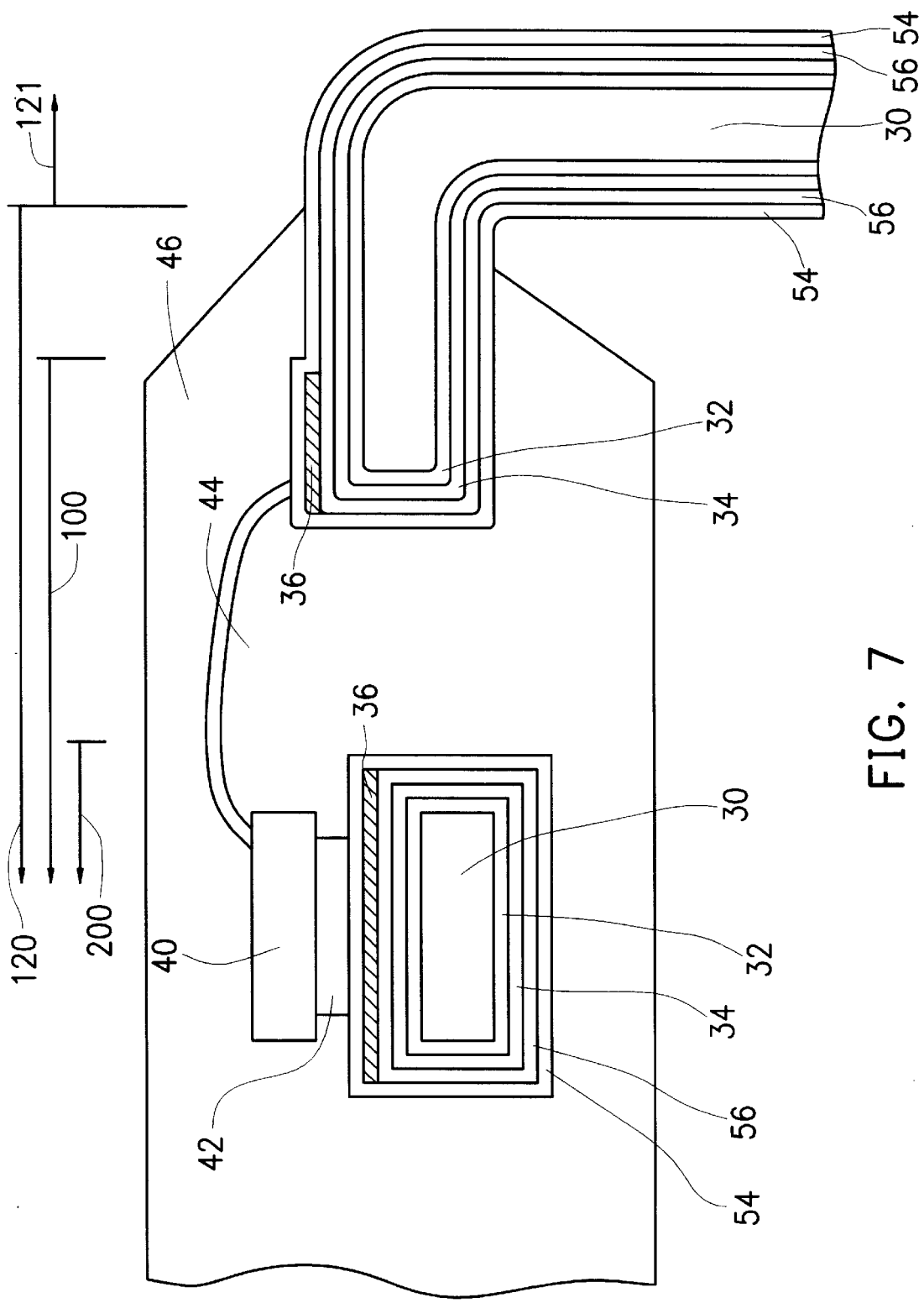
FIG. 7 is a schematic sectional diagram of a third preferred embodiment of the leadframe of the invention.

FIG. 7 shows a schematic sectional view of a third preferred embodiment of the leadframe according to the invention. In this sectional diagram, the package area is indicated by the reference numeral 120 on top of the drawing; the bonding area is indicated by the reference numeral 100; the die pad is indicated by the reference numeral 200; and the area beyond the package area, referred to as an external-lead area of the leadframe, is indicated by the reference numeral 121.

In the manufacturing process, the first step is to form a base structure 30 from a conductive material which is molded into a form as shown in FIG. 1. The base structure 30 of the leadframe can be made from various conductive materials such as copper alloys including Alloy 194, C7025, KCF125, EFTEC, or nickel/ferrite alloys such as the Ni—Fe 42 alloy. This base structure 30 is then subjected to a series of pre-plating processes, including degreasing, activating, etching, neutralizing, forming a copper layer 32 by striking over the entire base structure 30, and forming a nickel plating 34 over the copper layer 32. The copper layer 32 is used to improve the surface quality of the base structure 30 of the leadframe, and the nickel plating 34 is used to prevent erosion to the leadframe. If the base structure 30 is made from a conductive material of high surface quality, the step of forming the copper layer 32 can be eliminated. The step of forming the nickel plating 34 can be replaced by a subsequent step of forming a corrosion-resistant layer later over the leadframe.

Subsequently, a first silver (Ag) layer 56 is formed by striking over the entire surface of the nickel plating 34; and then a second silver (Ag) layer 36 is formed by spotting selectively only on the top side of the leadframe within the bonding area 100. Next, a palladium (Pd) plating 54 is formed over the first silver (Ag) layer 56 and the second silver (Ag) layer 36 over the entire leadframe. This completes the manufacture of the third preferred embodiment of the leadframe of the invention.

In conclusion, the third preferred embodiment provides a leadframe made from a base structure 30 of a conductive nature, such as a copper alloy, which is then formed successively with the copper layer 32 over the entire base structure 30 of the leadframe, the nickel plating 34 over the copper layer 32, the silver (Ag) layer 56 over the nickel plating 34, the second silver (Ag) layer 36 selectively formed only over the portions of the first silver (Ag) layer 56 that are settled in the bonding area 100 on the top side of the leadframe and the palladium (Pd) plating 54 over the first silver (Ag) layer 56 and the second silver (Ag) layer 36 over the entire base structure 30 of the leadframe.

In the subsequent packaging process, a chip 40 is mounted securely by using a gluing agent 42 on the die pad 200 of the leadframe 30. In the bonding process, a plurality of gold wires 44, each having one end bonded to one bonding pad (not shown) on the chip 40 and the other end bonded to the coin-lead tip 14 of the corresponding one of the internal leads 4 (shown in FIG. 1), are used to interconnect the chip 40 and the palladium (Pd) plating 54 on the coin-lead tip 14 of the internal leads 4 (shown in FIG. 1). A plastic casing 46 is then molded to enclose the chip 40, gold wires 44, and internal leads 4 therein, with the external-lead area 121 being exposed to the outside of the plastic casing 46.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A leadframe for an IC package to mount a semiconductor chip thereon, comprising:

a base structure of a conductive material, the base structure including an external-lead area and a package area including a bonding area, said bonding area further including a die pad therein for mounting a semiconductor chip thereon;

a first silver layer formed over the entire base structure of the leadframe;

a second silver layer selectively only over the first silver layer in the bonding area; and a palladium plating formed over the first silver layer and the second silver layer.

2. The leadframe of claim 1, wherein said base structure is made from an alloy of copper.

3. The leadframe of claim 1, wherein said base structure is made from an alloy of nickel/ferrite.

* * * * *